United States Patent [19]

Yamagishi et al.

[11] Patent Number: 5,179,560
[45] Date of Patent: Jan. 12, 1993

[54] APPARATUS FOR DECODING BCH CODE FOR CORRECTING COMPLEX ERROR

[75] Inventors: Atsuhiro Yamagishi; Touru Inoue; Tokumichi Murakami; Kohtaro Asai, all of Kanagawa, Japan

[73] Assignee: Mitsubishi Denki Kabushiki Kaisha, Japan

[21] Appl. No.: 445,174

[22] Filed: Dec. 4, 1989

[30] Foreign Application Priority Data

May 15, 1989 [JP] Japan .................................. 1-121909

[51] Int. Cl.⁵ ......................................... H03M 13/00
[52] U.S. Cl. .................................. 371/38.1; 371/39.1
[58] Field of Search ..................... 371/38.1, 41, 39.1

[56] References Cited

U.S. PATENT DOCUMENTS

| | | | |
|---|---|---|---|
| 3,078,443 | 2/1963 | Rose | 371/41 |
| 3,411,135 | 11/1968 | Watts | 371/38.1 |
| 3,544,963 | 12/1970 | Tong | 371/38.1 |
| 4,397,022 | 8/1983 | Weng et al. | 371/41 |
| 4,592,054 | 5/1986 | Namekawa | 371/38.1 |
| 4,618,955 | 10/1986 | Sharpe et al. | 371/38.1 |
| 4,646,303 | 2/1987 | Narusawa et al. | 371/37.1 |
| 4,764,927 | 8/1988 | Izumita et al. | 371/38.1 |
| 4,849,975 | 7/1989 | Patel | 371/38.1 |
| 4,868,828 | 9/1989 | Shas et al. | 371/39.1 |

FOREIGN PATENT DOCUMENTS 2131253 6/1984 United Kingdom .
2136248 9/1984 United Kingdom .

OTHER PUBLICATIONS

Maniar et al., Fire Codes on Custom Chip Clean Up Hard Disk Data; Electronics, May 1981.
Lin et al., Error Control Coding: Fundamentals and Applications, 1983.

Primary Examiner—Jerry Smith
Assistant Examiner—Henry C. Lebowitz
Attorney, Agent, or Firm—Wolf, Greenfield & Sacks

[57] ABSTRACT

An apparatus for decoding a received BCH code signal for correcting a combined complex error is disclosed which includes a syndrome generating circuit for generating two n-bit syndromes corresponding to the received signal, a syndrome converting circuit for converting the two n-bit syndromes to a 2n-bit syndrome, a random error correcting circuit, a burst error correcting circuit, two combining circuits and output selecting circuit. The random error correcting circuit receives input as the two n-bit syndromes and outputs a random error correction signal to one of the combining circuits and the burst error correcting circuit receives as input the 2n-bit syndrome and outputs a burst error correction signal to the other of the combining circuits. The combining circuits combine the correction signals with the received BCH code signal. The output selecting circuit selectively outputs one of the combined signals from the combining circuits in accordance with the decoding conditions of the error correcting circuits and the result of a comparison between the decoded and error-corrected signals from the combining circuits.

8 Claims, 5 Drawing Sheets

Fig. 6

| | | RANDOM ERROR CORRECTING CIRCUIT | |
|---|---|---|---|
| | | CORRECTION | ERROR DETECTION |
| BURST ERROR CORRECTING CIRCUIT | CORRECTION | ALL THE BIT PATTERNS AFTER CORRECTION ARE IDENTIAL<br>→ RIGHTLY CORRECTED | EMPLOY OUTPUT OF BURST ERROR CORRECTING CIRCUIT |
| | | THE PATTERNS AFTER CORRECTION ARE NOT IDENTICAL<br>→ UNCORRECTABLE ERROR DETECTED | |
| | ERROR DETECTION | EMPLOY OUTPUT OF RANDOM ERROR CORRECTING CIRCUIT | UNCORRECTABLE ERROR DETECTED |

APPARATUS FOR DECODING BCH CODE FOR CORRECTING COMPLEX ERROR

BACKGROUND OF THE INVENTION

1. Field of the Invention

The present invention relates to an error correction apparatus in a digital communication system using a BCH (Bose-Chandhuri-Hocqueghem) code, more particularly relates to a BCH code decoding apparatus for correcting a complex error in a digital communication system.

2. Description of the Prior Art

FIG. 1 is a block diagram showing a conventional combined-error-correcting circuit for correcting both random and burst errors, as described, for example, in "Error Control Coding: Fundamentals and Applications" by S. LIN and D.J. COSTELLO, Jr., pp. 280-282, published by Prentice-Hall, Inc., 1983. In the figure, numeral 1 is an input terminal for inputting a received coded message, 39 is a burst-error-correcting unit for correcting a burst error by burst trapping, 40 is a random-error-correcting unit for correcting a random error, 6 is an output selecting circuit for selecting either the output from the burst-error-correcting unit 39 or the output from the random-error-correcting unit 40 and 9 is an output terminal for outputting a decoded result.

The operation of the above-mentioned prior art will now be described. A received message which has been decoded at a transmitter site before transmitting and includes errors added in the communication path is input from the input terminal 1 into both the burst-error-correcting unit 39 and the random-error-correcting unit 40. The message is decoded by the respective correcting units, and either the decoded output from the burst-error-correcting unit 39 or the decoded output from the random-error-correcting unit 40 is selected by the output selecting circuit 6 in response to the condition of the communication path, and thereby the selected output is delivered from the output terminal 9 as an output of the complex error correcting circuit.

Since conventional complex error correcting circuits are generally arranged as described above, it is necessary to control the output selecting circuit 6 in response to the condition of the communication path with respect to the concrete error correcting code, but there is shown no definite suggestion as to how the condition of the communication path can be concretely grasped and there is also shown no criterion to appropriately judge such a condition, therefore it is difficult to accurately control the selecting circuit 6. There is a further problem that, because of the burst error correcting unit and the random error correcting unit being independently arranged from each other, it is necessary that the respective units independently include syndrome generating circuits for extracting the error condition.

SUMMARY OF THE INVENTION

It is an object of the present invention to solve such problems as described above and to obtain an apparatus for decoding a BCH code signal and for correcting a complex error combined in the BCH code signal which is capable of grasping the condition of the communication path, concretely providing a criterion for judging the condition of the communication path and commonly using a syndrome generating circuit for a burst error correcting unit and a random error correcting unit.

This object is achieved by an apparatus for decoding a BCH code used for correcting a complex error which is capable of grasping the condition of a communication path by using the decoded result of a burst error correcting unit with a burst trapping function as well as the decoded result of the random error correcting unit having a circuit for deciding the result of an operation with a circuit for making an operation of integers of modulo $2^n - 1$, thereby concretely providing a criterion for judging the condition of the communication path to control an output selecting circuit and there being further provided a means for converting a syndrome, thereby the common use of a syndrome generating circuit can be attained.

BRIEF DESCRIPTION OF THE DRAWINGS

FIG. 6 is a table showing the criterion for controlling the output selecting switch incorporated in the output selection control circuit shown in FIG. 5.

DETAILED DESCRIPTION OF THE PREFERRED EMBODIMENTS

Figure 1:
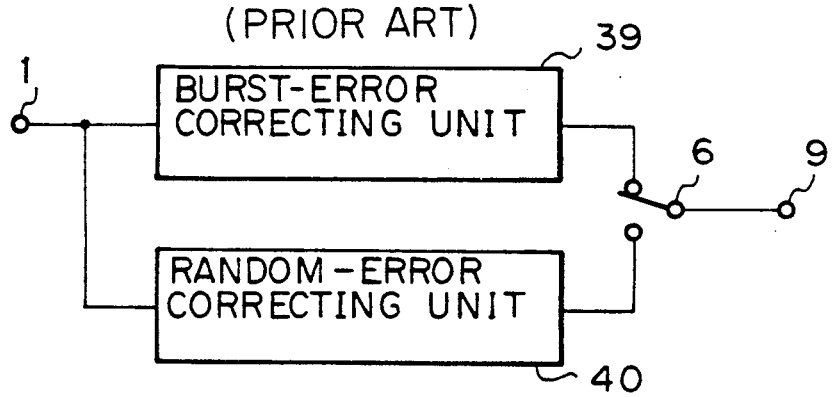
FIG. 1 illustrates a block diagram showing a conventional apparatus for decoding a BCH code with a correction function of a complex error.
Figure 2:
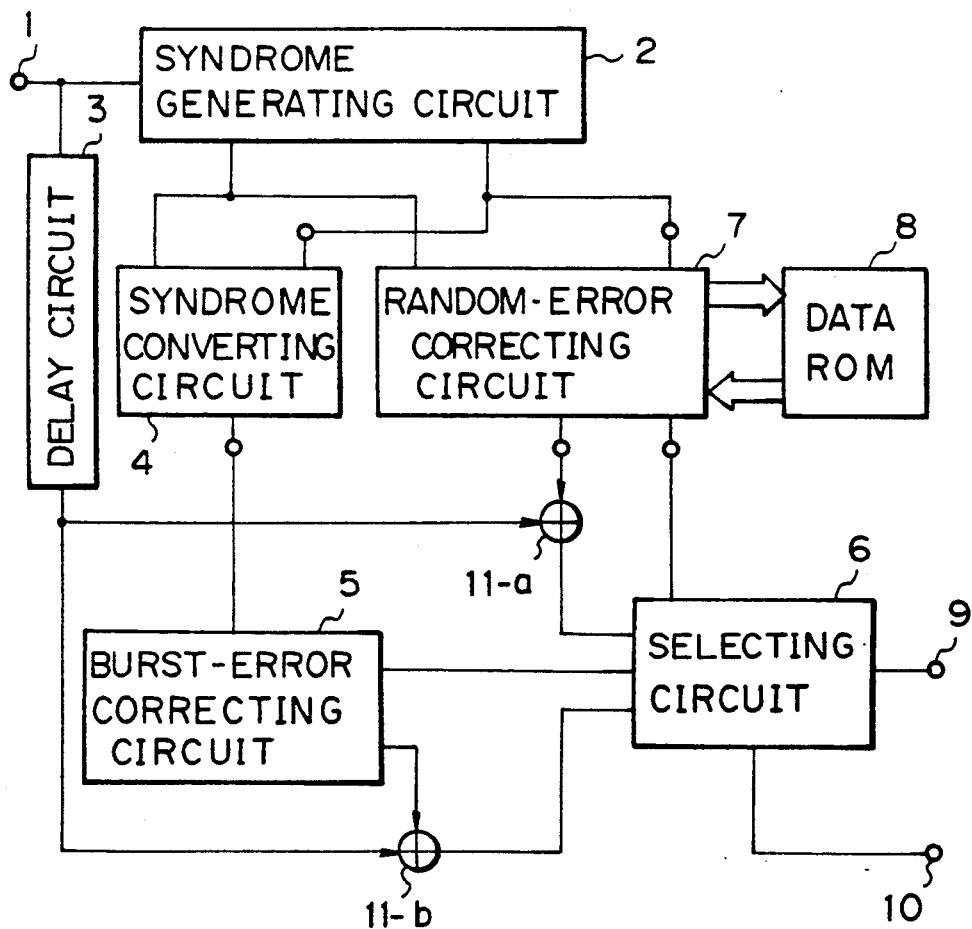
FIG. 2 is a block diagram showing an apparatus for decoding a BCH code with a correction function of a complex error according to this invention.

An embodiment of the present invention will now be described. Referring now to FIG. 2, there is shown in block diagram form an error correcting unit. In the drawing, numeral 1 denotes an input terminal for inputting a coded message received; 2, a syndrome generating circuit for generating two n-bit syndromes for correcting a random error; 3, a delay circuit for holding the received message during the period of generating the syndromes and correcting an error; 4, a syndrome converting circuit for performing a conversion from the two n-bit syndromes generated in the syndrome generating circuit 2, to a 2n-bit syndrome for a burst trapping circuit for correcting a burst error correcting; 5, a burst error correcting circuit for calculating the position in which a burst error is generated, and the pattern of the burst error; 6, an output selecting circuit incorporating a criterion for grasping and judging the condition of a communication path by using the decoded results of the burst error correcting circuit 5 and a random error correcting circuit mentioned next; 7, a random error correcting circuit for receiving, as an input, the syndrome which is vector expressed by the polynomial basis in a finite field and obtained with the syndrome generating circuit 2, converting the syndrome vector-expressed syndrome to an exponential expression of a primitive element of the finite field, obtaining an error position polynomial by normalizing the converted exponential repression with an integer operation of modulo $2^n - 1$, obtaining the radical of the normalized error position polynomial by looking up a table of the normalized error position pre-calculated the constant terms of the normalized error position polynomial, calculating the true error position from the normalized error position, and correcting the random error; 8, a data ROM for storing data for converting the syndrome vector-expressed by the polynomial basis in the finite field obtained by the syndrome generating circuit 2 into the exponential expression of the primitive element of the finite field and data of the normalized error position which is the radical of the normalized error position polynomial; 9, an output terminal for outputting the decoded results; 10, a terminal for outputting a signal when an uncorrectable error showing the final decoded condition is detected; and 11-a and 11-b, exclusive OR circuits for adding error correction pulses output from the burst error and random error correcting circuits 5 and 7 to the received message.

Figure 3:
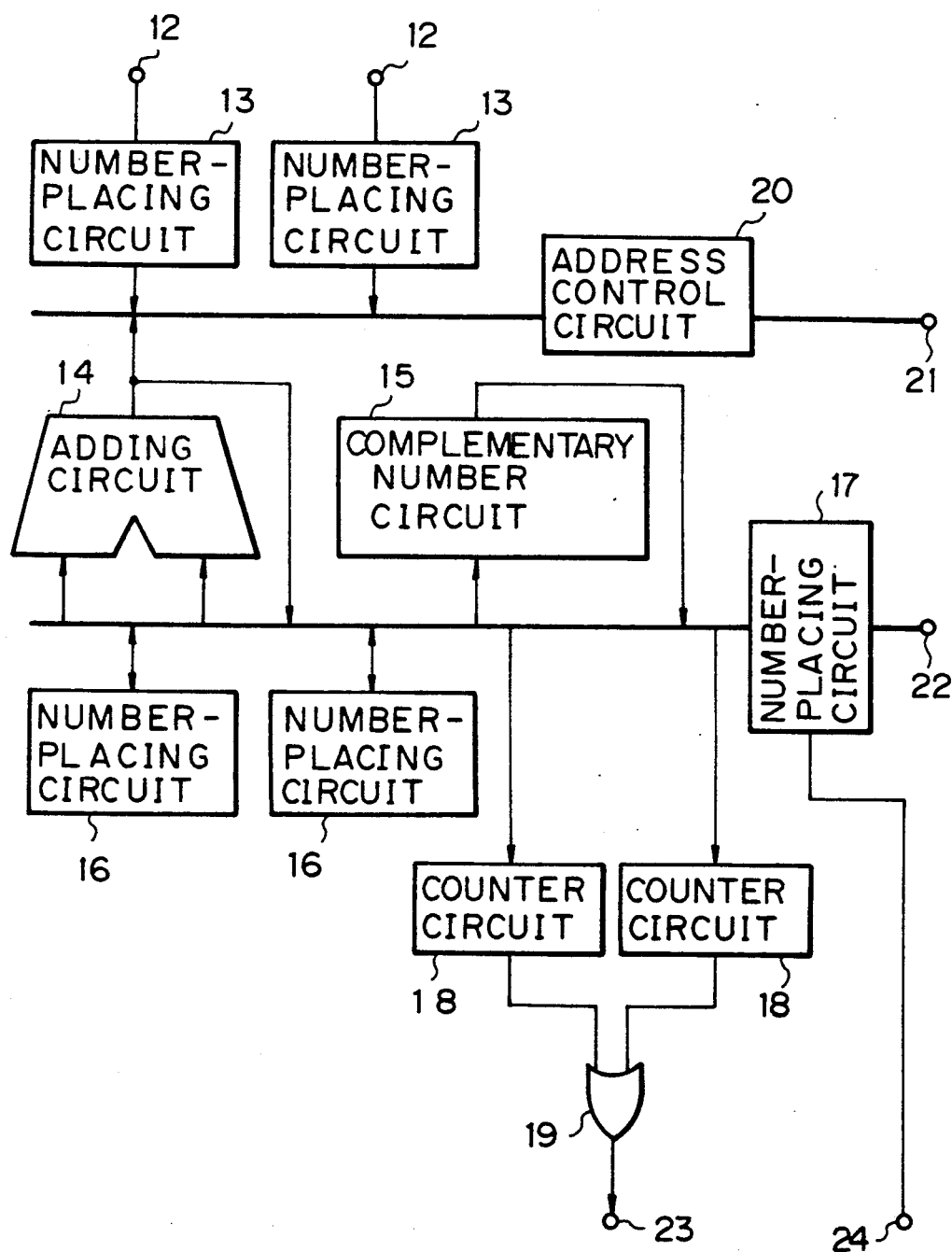
FIG. 3 is a block diagram showing details of the random error correcting circuit shown in FIG. 2.

FIG. 3 shows the details of the random error correcting circuit 7 shown in FIG. 2, and in this figure, numeral 12 is an input terminal for inputting the syndrome vector-expressed with the polynomial basis in the finite field obtained by the syndrome generating circuit 2 shown in FIG. 2, 13 a register for holding the input syndrome, 14 an adding circuit with modulo $2^n-1$, 15 a complementary number circuit with modulo $2^n-1$, 16 register for temporarily holding data, 18 counter circuits for calculating the true error position, 19 an OR circuit for mixing the correction pulses output from the counter circuits 18 and 18, 20 an address control circuit for outputting an address to the data ROM 8 which stores the data for converting the syndrome vector-expressed with the polynomial basis in the finite field to the exponential expression of the primitive element of the finite field and the data of the normalized error position which is a radical . of the normalized error position polynomial, "17 a register which receives the output of data ROM 8 and compares it to $2^n-1$. If the output of ROM 8 is equal to $2^n-1$, this indicates an uncorrectable error." 21 an address terminal for outputting and address to the data ROM 8, 22 a data input terminal to which data are inputted from the data ROM 8, 23 an output terminal for outputting the correction pulse, and 24 a terminal for outputting an uncorrectable error detection signal when an error can not be corrected by the random error correcting circuit 7.

Figure 4:
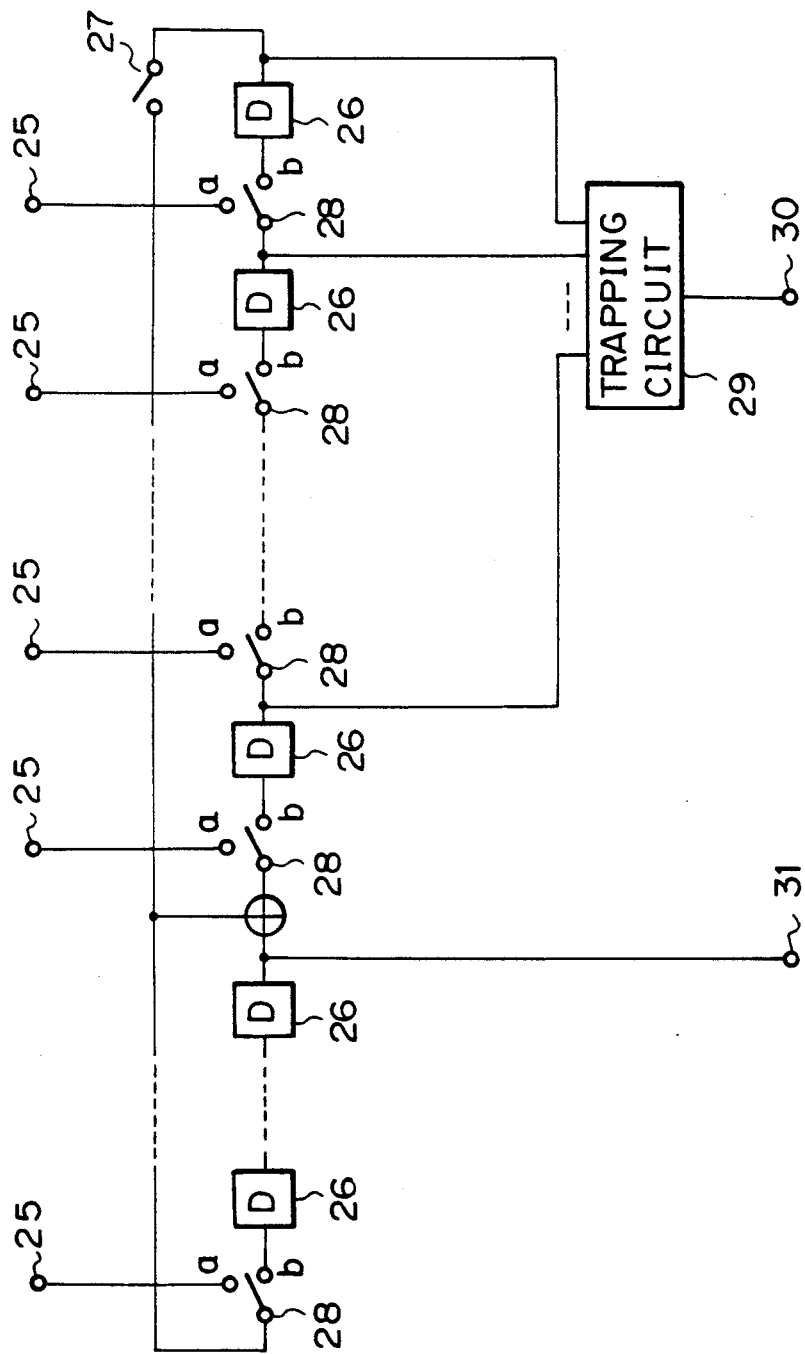
FIG. 4 is a detailed diagram of the burst error correcting circuit shown in FIG. 2.

FIG. 4 shows the details of the burst error correcting circuit 5 shown in FIG. 2 in which numeral 25 is an input terminal for inputting the output of the syndrome converting circuit 4 illustrated in FIG. 2, 26 a 1-bit delay circuit, 27 a switch for controlling a feedback circuit consisting of the delay circuits 26 connected in loop through the switch, 28 a selecting switch for selecting either the output from the syndrome converting circuit 4 or the data from the feedback circuit, 29 a trapping (zero detection) circuit for detecting the fact that the upper $(2n-b)$-bits of the linear feedback shift register of the feedback circuit having $2n$—bits in length become zero, 30 a terminal outputting an uncorrectable burst error detection signal when an error which can not be corrected by the burst error correcting circuit 5 is detected, and 31 an errorpattern output terminal for serially outputting an errorpattern to be corrected when the burst error is corrected.

Figure 5:
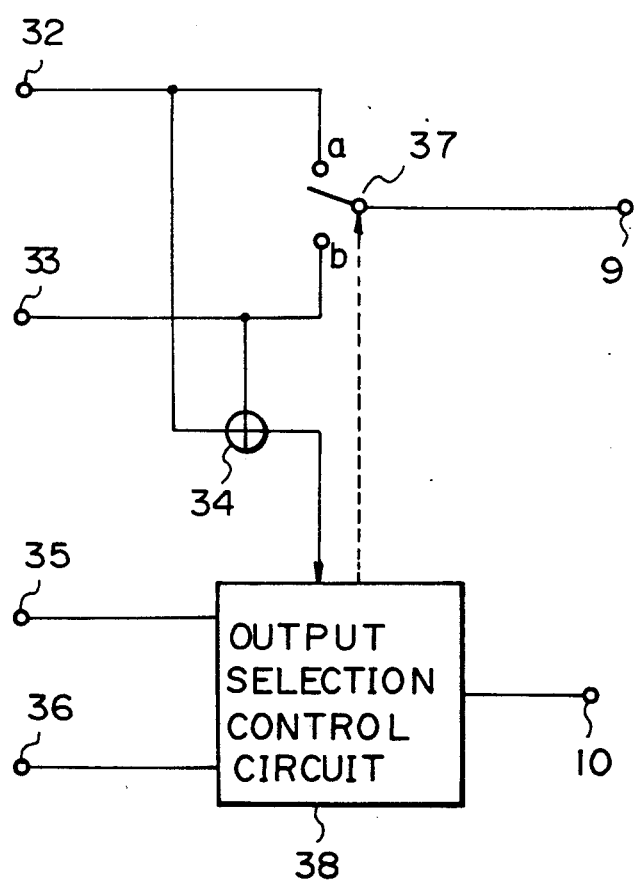
FIG. 5 shows a detailed diagram of the output selecting circuit illustrated in FIG. 2.

FIG. 5 is a detailed block diagram of the output selecting circuit 6 shown in FIG. 2 including the criterion for grasping and judging the condition of the communication path by using the decoded results of the burst error and random error correcting circuits 5 and 7 shown in FIG. 2. In FIG. 5, numeral 32 denotes an input terminal for the data which has been corrected by using the output from the random error correcting circuit 7, 33 and input terminal for data which has been corrected by using the output from the burst error correcting circuit 5, 34 an exclusive OR circuit for comparing the data corrected by the random error correcting circuit 7 and the data corrected by the burst error correcting circuit 5, 35 an input terminal of the uncorrectable error detection signal from the terminal 24 related to the random error correcting circuit 7, 36 an input terminal of the uncorrectable error detection signal from the terminal 31 related to the burst error correcting circuit 5, 37 an output selecting switch for selecting either the data corrected by the random error correcting circuit 7 or the data corrected by the burst error correcting circuit 5, and 38 an output selection control circuit for generating an uncorrectable signal to the terminal 10 (shown in FIGS. 2 and 4) depending on the uncorrectable error detection signals input from the random and burst error correcting circuits 7 and 5 to the input terminals 35 and 36, and the generating a control signal for controlling the output selecting switch 37 in accordance with the error detection signals and the output signal from the exclusive OR circuit 34 which compares the data input to the terminal 32, which has been corrected by the random error correcting circuit 7 and the data input to the terminal 33, which has been corrected by the burst error correcting circuit 5.

FIG. 6 is a table showing the criterion for controlling the output selecting switch 37 incorporated in the selecting circuit 6 and the criterion for deciding the uncorrectable error signal to the terminal 10.

The operation will now be described. A message which has been coded at a transmitter side and includes errors added at the communication path is received at the input terminal 1. Two n-bit syndromes $S_1$, $S_3$ expressed by vectors of the polynomial basis in the finite field are generated by the syndrome generating circuit 2. The two n-bit syndromes $S_1$, $S_3$ are then input to the random error correcting circuit 7 and the syndrome converting circuit 4. In the random error correcting circuit 7, the input syndromes $S_1$, $S_3$ are held in the register 13 and output as address of the data ROM 8 through the address control circuit 20 to the address output terminal 21. The syndromes $S_1$, $S_3$ are converted by the data ROM 8 from the vector expression with the polynomial basis in the finite field to the exponential expression of primitive element of finite field, log $S_1$ and log $S_3$. The converted syndromes log $S_1$ and log $S_3$, are stored into the register 16 by way of the data input terminal 22 and the register 17. Based on the exponentially expressed syndromes log $S_1$ and log $S_3$ stored in the register 16, the constant term (log $S_3 - 3 \times$ log $S_1$) of the normalized error position polynomial is calculated using the adding circuit 14 and the complementary number circuit 15, and the constant term (log $S_3 - 3 \times$ log $S_1$) is then output as address of the data ROM 8 through the address control circuit 20 and the address output terminal 21. The constant term (log $S_3 - 3 \times$ log $S_1$) is then converted by the data ROM 8 to two roots i=log $\alpha^i$ and j=log $\alpha^j$ of the normalized error position polynomial. $\alpha$ is a primitive element of a finite field and $\alpha^i$ and $\alpha^j$ are radicals of the normalized error position polynomial, they i.e., are represented the normalized error position. The two radicals i=log $\alpha^i$ and j=log $\alpha^j$ of the error position polynomial normalized by the data ROM 8 are directed through the data input terminal 22 and the register 17 and added by the adding circuit 14 with log $S_1$ and stored in the counter circuits 18 for calculating the true error position. At this time, the result of addition is checked by the register 17, and if it is in an uncorrectable condition, an uncorrectable error detection signal is output to the terminal 24. The true error position stored in the counter circuit 18 is counted down, and when the content of the counter circuit 18 becomes zero, an error correction pulse is given through the OR circuit 19 to the exclusive OR circuit 11-a.

On the other hand, the two n-bit syndromes $S_1$ and $S_3$ input into the syndrome converting circuit 4 are converted to 2n-bit syndromes and thereafter input to the burst error correcting circuit 5. For example, for (511, 493) BCH codes having the generated polynomial of:

$$g(x) = X^{18} + X^{15} + X^{12} + X^{10} + X^8 + X^7 + X^6 + X^3 + 1$$

the conversion is performed in accordance with the following equations:

$$Sl_0 = S_{17} + S_{14} + S_{13} + S_{11} + S_{10} + S_{37} + S_{34} + S_{33} + S_{31}$$

$$Sl_1 = S_{18} + S_{15} + S_{14} + S_{12} + S_{11} + S_{10} + S_{38} + S_{35} + S_{34} + S_{31} + S_{30}$$

$$Sl_2 = S_{16} + S_{15} + S_{13} + S_{12} + S_{11} + S_{10} + S_{36} + S_{35} + S_{33} + S_{31} + S_{30}$$

$$Sl_3 = S_{16} + S_{12} + S_{36} + S_{33} + S_{32}$$

$$Sl_4 = S_{17} + S_{13} + S_{37} + S_{34} + S_{33}$$

$$Sl_5 = S_{18} + S_{14} + S_{10} + S_{38} + S_{35} + S_{34} + S_{30}$$

$$Sl_6 = S_{17} + S_{15} + S_{14} + S_{13} + S_{37} + S_{36} + S_{35} + S_{34} + S_{33}$$

$$Sl_7 = S_{18} + S_{17} + S_{16} + S_{15} + S_{13} + S_{11} + S_{38} + S_{36} + S_{35} + S_{33} + S_{31}$$

$$Sl_8 = S_{18} + S_{16} + S_{13} + S_{12} + S_{11} + S_{10} + S_{36} + S_{33} + S_{32} + S_{31} + S_{30}$$

$$Sl_9 = S_{17} + S_{14} + S_{13} + S_{12} + S_{11} + S_{37} + S_{34} + S_{33} + S_{32} + S_{31}$$

$$Sl_{10} = S_{18} + S_{17} + S_{15} + S_{12} + S_{11} + S_{38} + S_{37} + S_{35} + S_{32} + S_{31}$$

$$Sl_{11} = S_{18} + S_{16} + S_{13} + S_{12} + S_{10} + S_{38} + S_{36} + S_{33} + S_{32} + S_{30}$$

$$Sl_{12} = S_{10} + S_{30}$$

$$Sl_{13} = S_{11} + S_{31}$$

$$Sl_{14} = S_{12} + S_{32}$$

$$Sl_{15} = S_{17} + S_{14} + S_{11} + S_{10} + S_{37} + S_{34} + S_{31} + S_{30}$$

$$Sl_{16} = S_{18} + S_{15} + S_{12} + S_{11} + S_{38} + S_{35} + S_{32} + S_{31}$$

$$Sl_{17} = S_{16} + S_{13} + S_{12} + S_{10} + S_{36} + S_{33} + S_{32} + S_{30}$$

In the burst error correcting circuit 5, the switch 27 for controlling the feedback is closed and the selecting switches 28 are turned to the sides "a" connected to the input terminals 25 so that the two n-bit syndromes converted by the syndrome converting circuit 4 are inputted to the delay circuit 26 of the linear feedback shift register circuit having 2n-bit in length. The selecting switch 28 is then turned to the linear feedback shift register circuit sides "b" and the burst error pattern is checked by the trapping (zero detection) circuit 29 while performing the shifting operation. If the burst error pattern is detected by the trapping (zero detection) circuit 29, the switch 27 is opened and the error pattern is serially output from the error pattern output terminal 31 to the exclusive OR circuit 11-b. At this time, if no error pattern is detected by the shifting operation throughout the code length, the signal of uncorrectable error detected by the trapping (zero detection) circuit 29 is output to the terminal 30.

If an error pattern is detected at the random error correcting circuit 7 or the burst error correcting circuit 5, the received message is read out from the delay circuit 3 in which the received message has been held, the respective error patterns detected at the random and burst error correcting circuits 7 and 5 are separately combined to the received message by the exclusive OR circuits 11-a, 11-a, and thus the random and burst errors are corrected to provide their decoded messages. Thereafter, the decoded messages corrected by the random error and burst error correcting circuits 7 and 5 and the outputs from the uncorrectable error detection terminals 24, 30 connected to the random error and burst error correcting circuits 7 and 5 are input to the output selecting circuit 6. In the output selecting circuit 6, the respective messages input from the random error and burst error correcting circuits 7 and 5 are compared by the exclusive OR circuit 34. The result of comparison by the exclusive OR circuit 34 and the uncorrectable error detection signals from the terminals 24, 30 are input to the output selection control circuit 38 which, in turn, controls the output selecting switch 37 in accordance with the criterion of output selection shown in FIG. 6. Thus, if both of the uncorrectable error detection signals from the terminals 24, 30 indicates correction and if the output of the exclusive OR circuit 34 which compares the respective decoded messages indicates that the decoded messages are identical, then the output selecting switch 37 is turned to its "a"-side to select the output of the random error correcting circuit 7 through the exclusive OR circuit 11-a, and if the uncorrectable error detection signal from the terminal 24 shows correction and the uncorrectable error detection signal from the terminal 30 detects an uncorrectable error, the output selecting switch 37 is turned to its "a"-side to select the same output as above, and if the uncorrectable error detection signal from the terminal 30 indicates correction and the uncorrectable error detection signal from the terminal 24 shows detection of any uncorrectable error, then the output selecting switch 37 is turned to its "b"-side to select the output of the burst error correcting circuit 5 through the exclusive OR circuit 11-b, and in other cases, the signal which represents the existence of an uncorrectable error is output at the terminal 10. The final decoded message selected by the output selecting circuit 6 is output through the output terminal 9.

In the above-described embodiment, the random error correction circuit 7 is provided with the circuit performing operation with modulo $2^n - 1$, but there may be provided a random error correcting circuit using a conventional linear period shift register circuit. Furthermore, the code length is not definitely limited, but it is a matter of course that a similar effect can also be brought forth with a shortened code.

As described above, according to the present invention, there can effectively be provided a higher reliable circuit for decoding a BCH code in order to correct a complex error by the provision of the output selecting circuit incorporating the criterion of selecting the outputs of the random error and burst error correcting circuits.

It is further understood by those skilled in the art that the foregoing description is a preferred embodiment of the disclosed device and that various changes and modifications may be made in the invention without departing from the spirit and scope thereof.

What is claimed is:

1. An apparatus for decoding a received BCH code signal on a communication path for correcting complex error comprising;
    a syndrome generating circuit for generating two syndromes for correcting a random error of said BCH code signal;
    a first unit for correcting a random error of said BCH code signal by using decoding means, said first unit being connected to said syndrome generating circuit to receive and use the two syndromes in correcting the random error;
    a syndrome converting circuit, connected to said syndrome generating circuit, for converting said two syndromes into a single converted syndrome;
    a second unit for correcting a burst error of said BCH code signal by using decoding means, said second unit being connected to said syndrome generating circuit to receive and use the converted syndrome in correcting the burst error; and
    a third unit connected to said first and second units for deciding which output signal of said first or second unit is to be selectively output in response to the condition of the communication path, said third unit including;
    means for grasping the condition of the communication path, said means connected to the first and second units to received decoded output signals from said first and second units wherein the output signals are used to grasp the condition of the communication path; and
    means for judging the condition of the communication path as obtained by the means for grasping to determine which output signal of said first and second units is to be selectively output.

2. An apparatus according to claim 1, wherein said first unit comprises;
    random error correcting means for calculating a true random error position of said received BCH code signal in accordance with said syndromes and outputting a random error correction signal; and
    first combining means for combining said random error correction signal with said received BCH code signal, thereby a random error corrected BCH code signal is output.

3. An apparatus according to claim 2, wherein said random error correcting means comprises:
    means for converting said patterns of said syndromes generated by said syndrome generating circuit to an exponential expression with primitive elements;
    means for normalizing said converted exponential expression with an integer operation of modulo $2^n-1$ so as to obtain an error position polynomial;
    means for looking up a table storing pre-calculated roots of said error position polynomial and for obtaining a normalized error position; and
    means for calculating said true random error position based on said obtained normalized error position to output said random error correction signal.

4. An apparatus according to claim 2, wherein said second unit comprises:
    burst error correcting means for calculating a true burst error position of said received BCH code signal in accordance with said 2n-bit syndrome and outputting a burst error correction signal; and
    second combining means for combining said burst error correction signal to said received BCH code signal, thereby a burst error corrected BCH code signal is output.

5. An apparatus according to claim 4, wherein said random error correcting means includes first detecting means for detecting an uncorrectable random error and said burst error correcting means includes second detecting means for detecting an uncorrectable burst error.

6. An apparatus according to claim 5, wherein said third unit comprises:
    switching means for selectively outputting one of the outputs from said first and second combining means;
    third detecting means for detecting whether or not said outputs from said first and second combining means are the same; and
    control means connected to said first and second detecting means of said first and second unit and said third detecting means, for outputting a switching control signal to said switching means.

7. An apparatus according to claim 4, wherein said burst error correcting means comprises 2n-bit linear feedback shift register means which inputs said 2n-bit syndrome and trapping detecting means for detecting a burst error pattern of said registered 2n-bit syndrome by means of zero detection.

8. An apparatus according to claim 4 further comprising delay means for holding said received BCH code signal till said random and burst error correcting means output said random and burst error correction signal and thereafter outputting said received BCH code signal.

* * * * *